(12) United States Patent
Katou et al.

(10) Patent No.: US 11,495,716 B2
(45) Date of Patent: Nov. 8, 2022

(54) LIGHT-EMITTING DEVICE AND ILLUMINATION APPARATUS

(71) Applicant: KYOCERA Corporation, Kyoto (JP)

(72) Inventors: Hidetaka Katou, Omihachiman (JP); Tamio Kusano, Higashiomi (JP); Kiyotaka Yokoi, Hikone (JP)

(73) Assignee: KYOCERA CORPORATION, Kyoto (JP)

( * ) Notice: Subject to any disclaimer, the term of this patent is extended or adjusted under 35 U.S.C. 154(b) by 13 days.

(21) Appl. No.: 16/975,804

(22) PCT Filed: Feb. 26, 2019

(86) PCT No.: PCT/JP2019/007331
§ 371 (c)(1),
(2) Date: Aug. 26, 2020

(87) PCT Pub. No.: WO2019/164014
PCT Pub. Date: Aug. 29, 2019

(65) Prior Publication Data
US 2020/0411734 A1 Dec. 31, 2020

(30) Foreign Application Priority Data
Feb. 26, 2018 (JP) .............................. JP2018-031848

(51) Int. Cl.
*H01L 33/50* (2010.01)
*H01L 25/075* (2006.01)
(Continued)

(52) U.S. Cl.
CPC ........ *H01L 33/504* (2013.01); *H01L 25/0753* (2013.01); *H01L 33/486* (2013.01);
(Continued)

(58) Field of Classification Search
CPC . H01L 33/504; H01L 25/0753; H01L 33/486; H01L 33/60; F21V 29/70; F21Y 2103/10; F21Y 2115/10
See application file for complete search history.

(56) References Cited

U.S. PATENT DOCUMENTS 6,084,250 A   7/2000 Juestel et al.
2009/0033201 A1* 2/2009 Shimooka ........... C09K 11/7734
                                                           423/385
(Continued)

FOREIGN PATENT DOCUMENTS

DE   202009019150 U1 *  2/2017  ......... H01L 25/0753
JP   10-241631 A         9/1998
(Continued)

*Primary Examiner* — Rajarshi Chakraborty
*Assistant Examiner* — Glenn D Zimmerman
(74) *Attorney, Agent, or Firm* — Volpe Koenig

(57) ABSTRACT

A light-emitting device in an aspect of the present invention includes at least one light emitter, a first phosphor, and a second phosphor. The first phosphor emits, in response to light emitted from the at least one light emitter, light having a first peak wavelength in a wavelength region of 400 to 480 nm. The second phosphor emits, in response to light emitted from the at least one light emitter, light having a second peak wavelength in a wavelength region of 480 to 600 nm. The at least one light emitter has a third peak wavelength in a wavelength region of 280 to 315 nm and emits light in the wavelength region of 280 to 315 nm.

17 Claims, 8 Drawing Sheets

(51) Int. Cl.
    *H01L 33/48*     (2010.01)
    *H01L 33/60*     (2010.01)
    *F21V 29/70*     (2015.01)
    *F21Y 103/10*     (2016.01)
    *F21Y 115/10*     (2016.01)

(52) U.S. Cl.
    CPC .............. *H01L 33/60* (2013.01); *F21V 29/70* (2015.01); *F21Y 2103/10* (2016.08); *F21Y 2115/10* (2016.08)

(56) References Cited

U.S. PATENT DOCUMENTS

| | | |
|---|---|---|
| 2009/0224652 A1 | 9/2009 | Li et al. |
| 2009/0309112 A1 | 12/2009 | Yoshimatsu |
| 2016/0096991 A1* | 4/2016 | Hirosaki .................. C08K 3/34 252/301.4 F |
| 2016/0338169 A1 | 11/2016 | Rantala |
| 2018/0045866 A1* | 2/2018 | Chae ..................... G02F 1/1336 |
| 2018/0171220 A1* | 6/2018 | Li .......................... C09K 11/73 |
| 2019/0013445 A1* | 1/2019 | Leano, Jr. .......... C09K 11/7721 |
| 2020/0135986 A1* | 4/2020 | Kusano ..................... F21V 9/38 |

FOREIGN PATENT DOCUMENTS

| | | | |
|---|---|---|---|
| JP | 2000-509912 A | | 8/2000 |
| JP | 2007-169428 A | | 7/2007 |
| JP | 2007-188799 A | | 7/2007 |
| JP | 2010070773 A | * | 4/2010 |
| JP | 2012-009684 A | | 1/2012 |
| JP | 2015-060921 A | | 3/2015 |
| JP | 2015-126160 A | | 7/2015 |
| JP | 2017-222750 A | | 12/2017 |
| WO | 2017/080807 A1 | | 5/2017 |

\* cited by examiner

LIGHT-EMITTING DEVICE AND ILLUMINATION APPARATUS

FIELD

The present invention relates to a light-emitting device including a light-emitting diode (LED), and to an illumination apparatus.

BACKGROUND

Recent illumination apparatuses may include semiconductor light emitters such as light-emitting diodes (LEDs) as light sources, instead of fluorescent or incandescent lamps. For example, illumination apparatuses including such light emitters as light sources are used for visual inspection of painted surfaces of, for example, home appliances and automobiles.

A semiconductor light emitter emits light with a narrow region of wavelengths, and simply emits monochromatic light. To produce white light as illumination light, multiple semiconductor light emitters that emit light in different wavelength regions are prepared, and multiple light beams with different colors emitted from such semiconductor light emitters are mixed to into white light. In some cases, multiple phosphors that emit fluorescence in different wavelength regions using excitation light with the same wavelength are prepared, and light emitted from a semiconductor light emitter and multiple fluorescence beams with different colors emitted with excitation light from the semiconductor light emitter are mixed into white light. This method of mixing colors allows production of a light source that emits white light or that emits light with another spectrum for intended use (refer to Japanese Unexamined Patent Application Publication No. 2015-126160).

However, the technique described in Japanese Unexamined Patent Application Publication No. 2015-126160 may cause illuminated surfaces to appear differently when illuminated with white light and when observed with sunlight.

BRIEF SUMMARY

A light-emitting device according to one aspect of the present invention includes at least one light emitter, a first phosphor, and a second phosphor. The first phosphor emits, in response to light emitted from the at least one light emitter, light having a first peak wavelength in a wavelength region of 400 to 480 nm. The second phosphor emits, in response to light emitted from the at least one light emitter, light having a second peak wavelength in a wavelength region of 480 to 600 nm. The at least one light emitter has a third peak wavelength in a wavelength region of 280 to 315 nm and emits light in the wavelength region of 280 to 315 nm.

An illumination apparatus according to another aspect of the present invention includes one or more of the above light-emitting devices and a housing including the one or more of the light-emitting devices.

An illumination apparatus according to still another aspect of the present invention includes a plurality of light-emitting devices each including a light emitter. A mixture of light emitted from the plurality of light-emitting devices has a first peak wavelength in a wavelength region of 400 to 480 nm, a second peak wavelength in a wavelength region of 480 to 600 nm, and a third peak wavelength in a wavelength region of 280 to 315 nm.

DETAILED DESCRIPTION

A light-emitting device and an illumination apparatus according to one or more embodiments of the present invention will now be described with reference to the drawings.

Structure of Light-Emitting Device

Figure 1:
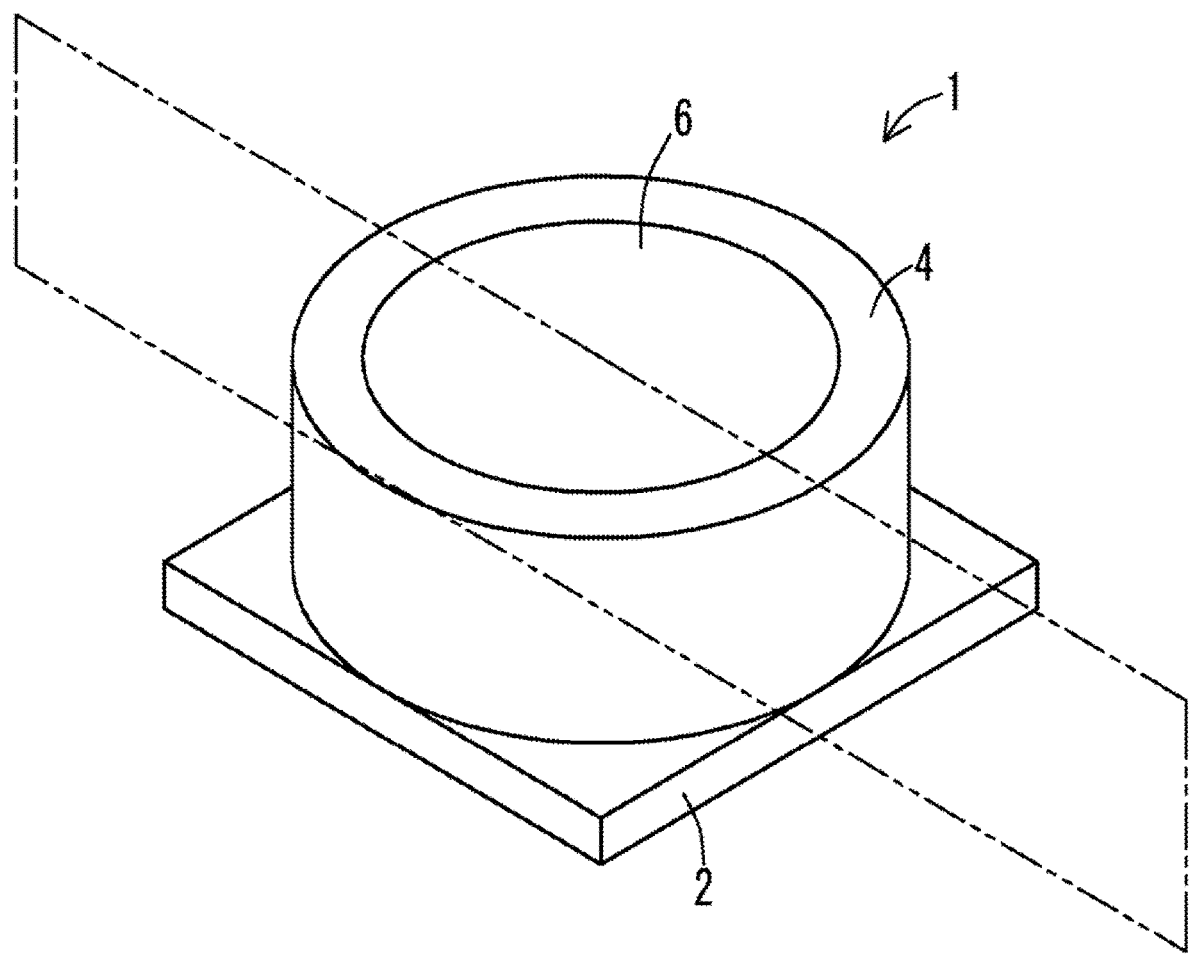
FIG. 1 is an external perspective view of a light-emitting device according to an embodiment of the present invention.
Figure 2:
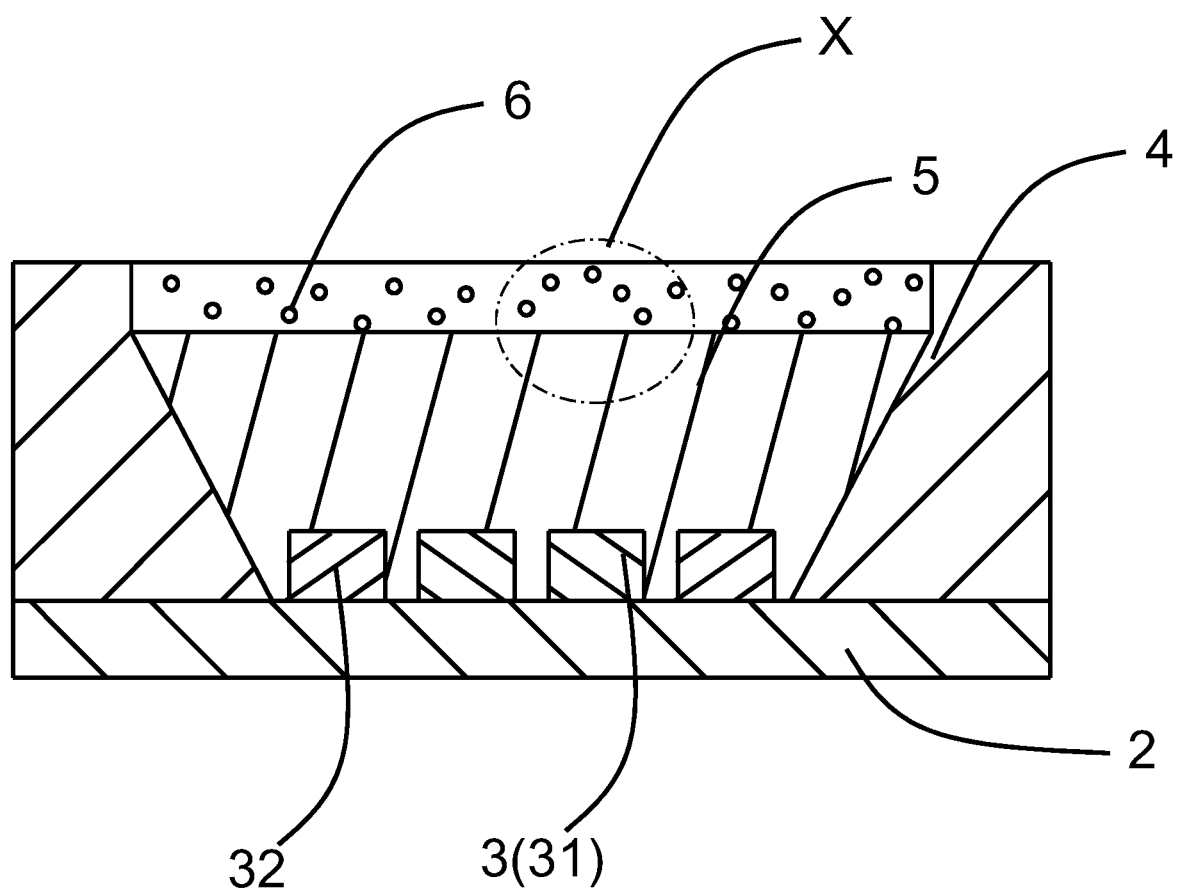
FIG. 2 is a cross-sectional view of the light-emitting device taken along a plane indicated by an imaginary line shown in FIG. 1.
Figure 3:
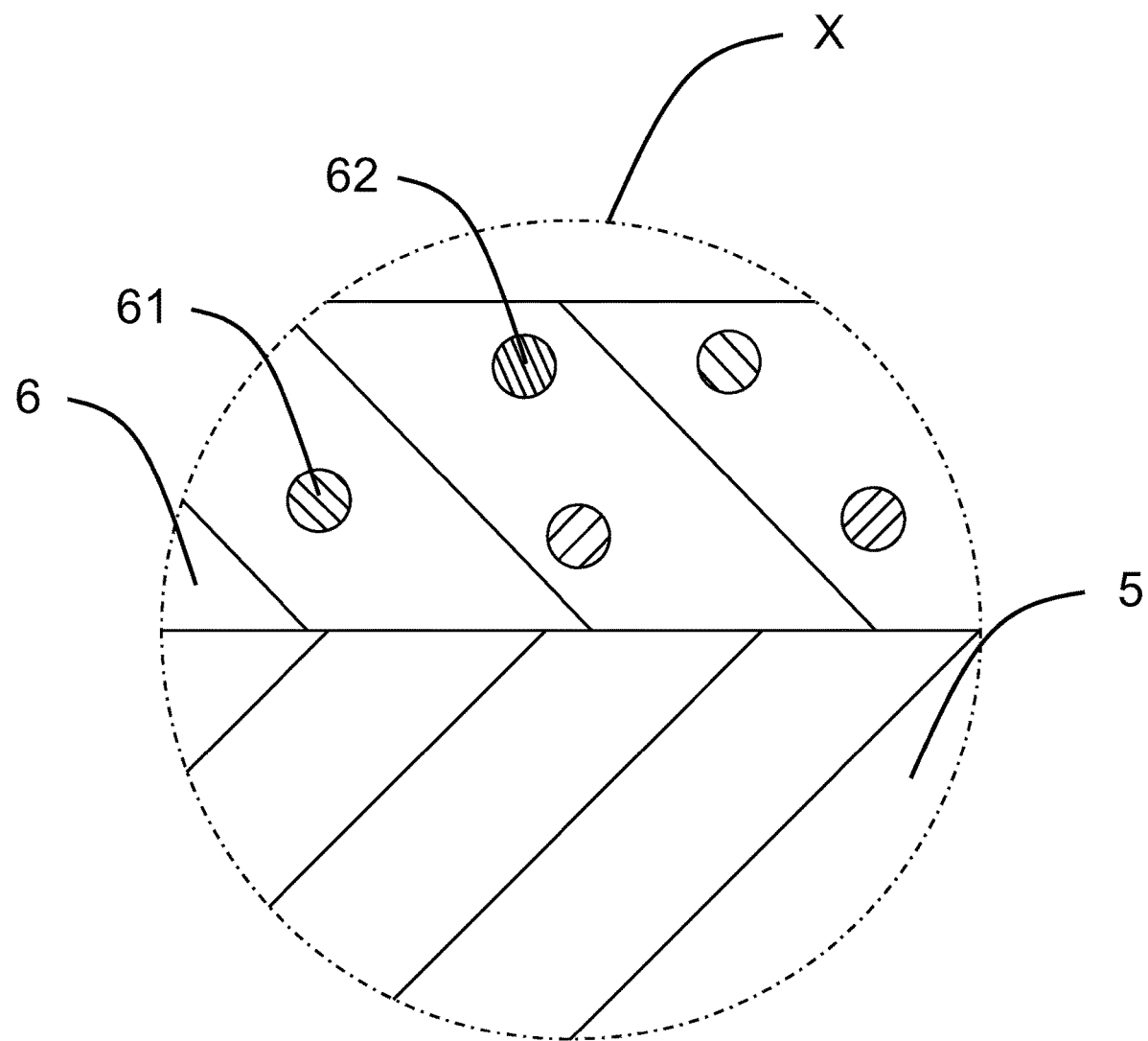
FIG. 3 is an enlarged view of the light-emitting device shown in FIG. 2.
Figure 4:
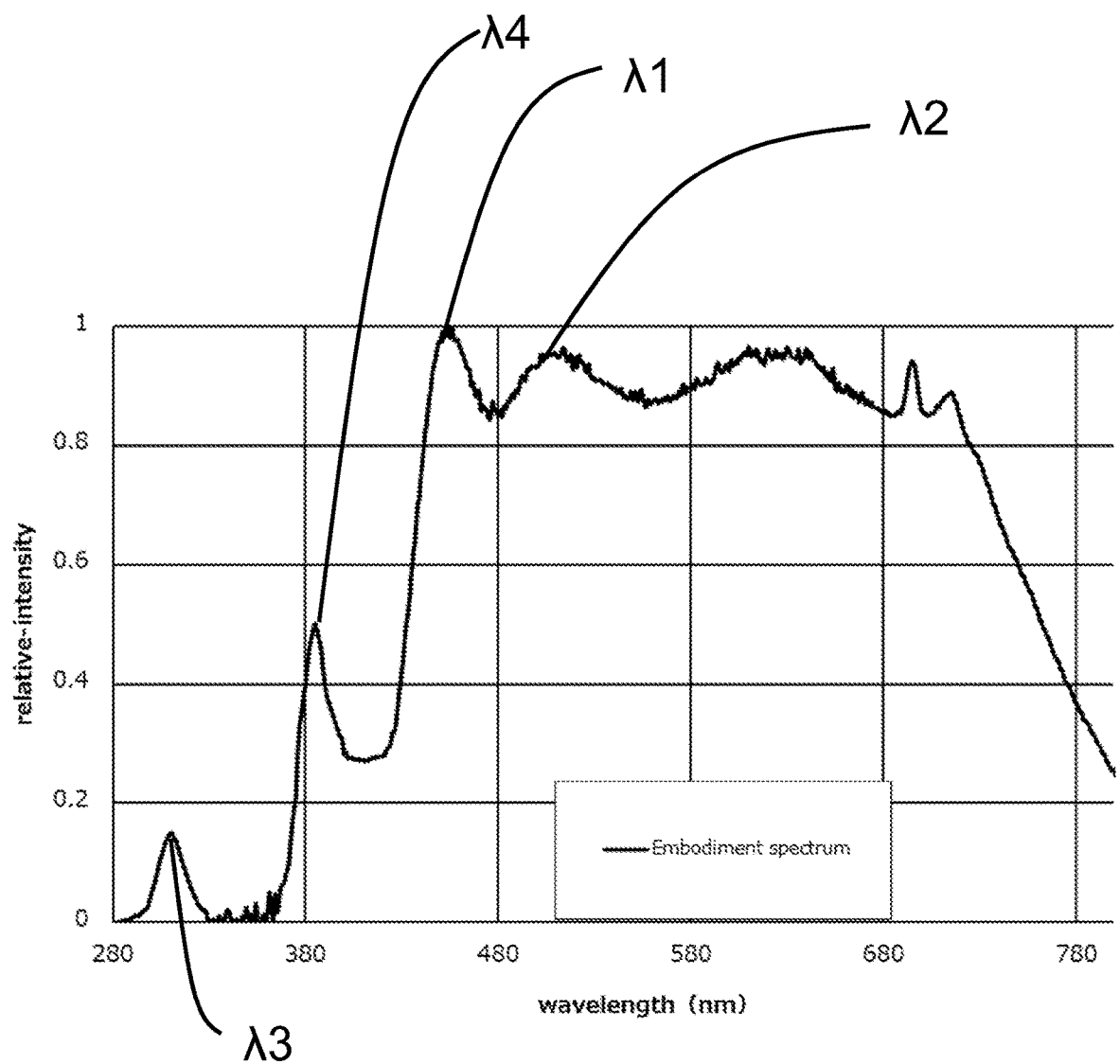
FIG. 4 is a graph showing the spectrum of external emission light from the light-emitting device according to the embodiment of the present invention.
Figure 5:
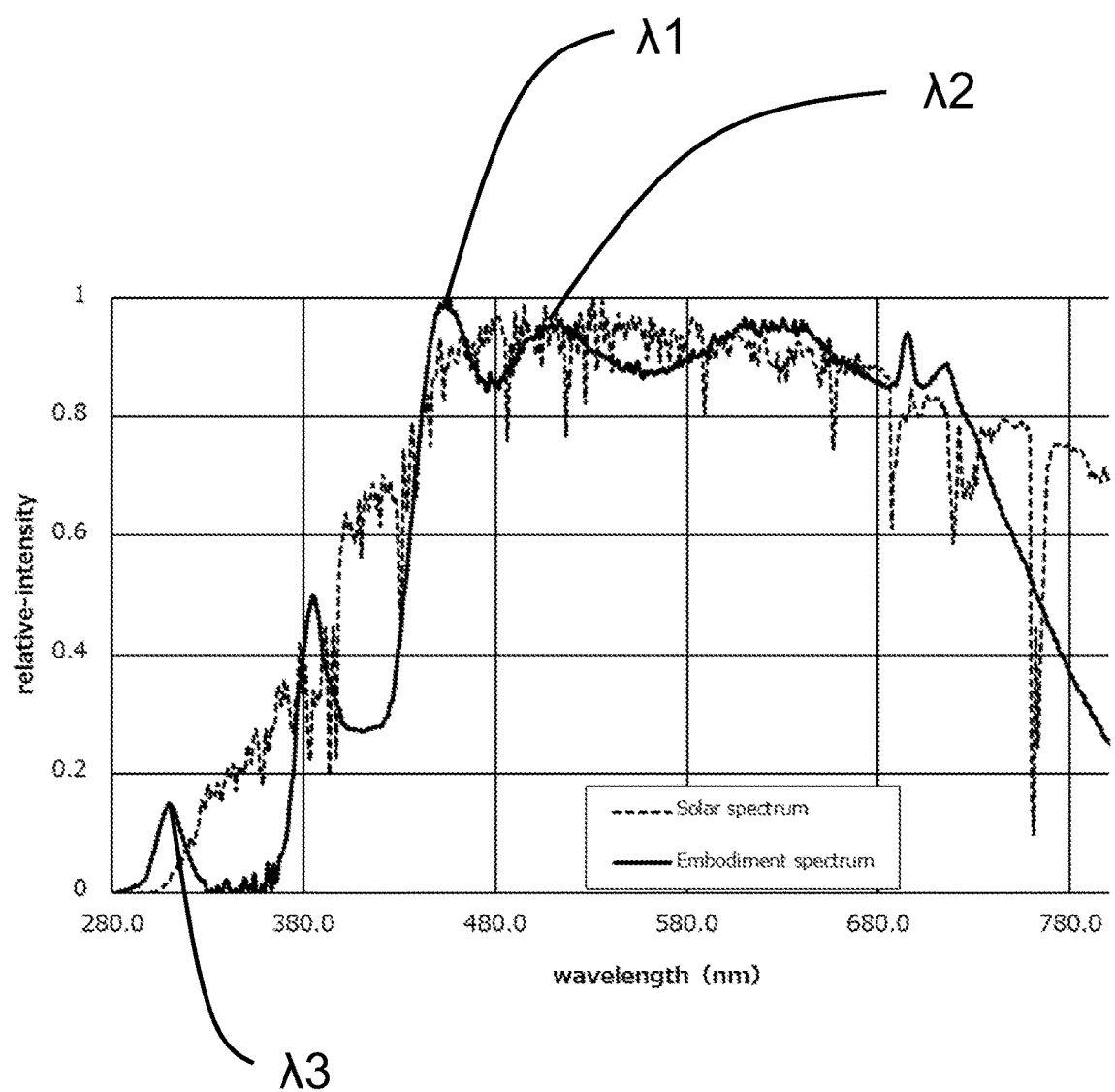
FIG. 5 is a graph showing a solar spectrum in addition to the spectrum shown in FIG. 4.

FIG. 1 is an external perspective view of a light-emitting device according to an embodiment of the present invention. FIG. 2 is a cross-sectional view of the light-emitting device taken along a plane indicated by an imaginary line shown in FIG. 1. FIG. 3 is an enlarged view of the light-emitting device shown in FIG. 2. FIG. 4 is a graph showing the spectrum of external emission light from the light-emitting device according to the embodiment of the present invention. FIG. 5 is a graph showing a solar spectrum in addition to the spectrum shown in FIG. 4. As shown in these figures, a light-emitting device 1 includes a substrate 2, light emitters 3, a frame 4, a sealant 5, and a wavelength conversion member 6.

The light-emitting device 1 includes the substrate 2, the light emitters 3 located on the substrate 2, the frame 4 located on the substrate 2 to surround the light emitters 3, the sealant 5 filling an inner space defined by the frame 4 except an upper area of the inner space defined by the frame 4, and the wavelength conversion member 6 placed on the upper surface of the sealant 5 in the upper area of the inner space defined by the frame 4 to fit inside the frame 4. Each light emitter 3 is, for example, a light-emitting diode (LED), and emits light outward when electrons and holes in the p-n junction in semiconductors are recombined.

The substrate 2 is an insulating substrate, and is formed from, for example, a ceramic material such as alumina or mullite, or a glass ceramic material. In some embodiments, the substrate 2 may be formed from a composite material containing two or more of these materials. The substrate 2 may contain a polymeric resin in which metal oxide particles are dispersed to adjust the thermal expansion of the substrate 2.

The substrate 2 has, on at least its main surface or inside, a wiring conductor that provides electrical connection inside and outside the substrate 2. The wiring conductor is formed from, for example, a conductive material such as tungsten, molybdenum, manganese, or copper. The substrate 2 formed from a ceramic material may be prepared by, for example, applying a metal paste containing powder of, for example, tungsten containing an organic solvent in a predetermined pattern to a ceramic green sheet, which is to be the substrate 2, by printing, stacking multiple ceramic green sheets prepared in this manner on one another, and firing the structure. The surface of the wiring conductor is plated with, for example, nickel or gold for preventing oxidation. The upper surface of the substrate 2 may be coated with a metal reflective layer that is formed from, for example, aluminum, silver, gold, copper, or platinum, and is spaced from the wiring conductor and the plating layer to efficiently reflect light upward from the substrate 2.

The light emitters 3 are mounted on the main surface of the substrate 2. The light emitters 3 are electrically connected on the plating layer on the surface of the wiring conductor on the main surface of the substrate 2 with, for example, a brazing material or solder. Each light emitter 3 includes a translucent base and an optical semiconductor layer formed on the translucent base. The translucent base allows the optical semiconductor layer to be deposited by chemical vapor deposition, such as metal organic chemical vapor deposition or molecular beam epitaxy. The translucent base may be formed from, for example, sapphire, gallium nitride, aluminum nitride, zinc oxide, zinc selenide, silicon carbide, silicon, or zirconium boride. The translucent base has a thickness of, for example, 50 to 1000 μm inclusive.

The optical semiconductor layer includes a first semiconductor layer formed on the translucent base, a light-emitting layer formed on the first semiconductor layer, and a second semiconductor layer formed on the light-emitting layer. The first semiconductor layer, the light-emitting layer, and the second semiconductor layer are formed from, for example, a group III nitride semiconductor, a group III-V semiconductor such as gallium phosphide or gallium arsenide, or a group III nitride semiconductor such as gallium nitride, aluminum nitride, or indium nitride. The first semiconductor layer has a thickness of, for example, 1 to 5 μm inclusive. The light-emitting layer has a thickness of, for example, 25 to 150 nm inclusive. The second semiconductor layer has a thickness of, for example, 50 to 600 nm inclusive. Each light emitter 3 formed in this manner may emit excitation light with a wavelength range of, for example, 280 to 450 nm inclusive.

The frame 4 is formed from a resin material that is a mixture of powders of, for example, a ceramic material such as aluminum oxide, titanium oxide, zirconium oxide, or yttrium oxide, a porous material, or a metal oxide such as aluminum oxide, titanium oxide, zirconium oxide, or yttrium oxide. The frame 4 is bonded to the main surface of the substrate 2 with, for example, a resin, a brazing material, or solder. The frame 4 is spaced from the light emitters 3 on the main surface of the substrate 2 to surround the light emitters 3. The frame 4 has a sloping inner wall that flares away from the main surface of the substrate 2. The inner wall of the frame 4 serves as a reflection surface for reflecting excitation light emitted from the light emitters 3. When the inner wall of the frame 4 is circular as viewed from above, the reflection surface can uniformly reflect light emitted from the light emitters 3 externally.

The sloping inner wall of the frame 4 may have, for example, a metal layer of tungsten, molybdenum, or manganese formed on the inner periphery of the frame 4 formed from a sintered material, and a plating layer of nickel or gold covering the metal layer. The plating layer reflects light emitted from the light emitters 3. The inner wall of the frame 4 may have a slope angle of, for example, 55 to 70° inclusive with respect to the main surface of the substrate 2.

The inner space defined by the substrate 2 and the frame 4 is filled with the sealant 5, which transmits light. The sealant 5, which seals the light emitters 3, receives light emitted from inside the light emitters 3. Further, the sealant 5 can transmit the light received from the light emitters 3. The sealant 5 fills the inner space defined by the substrate 2 and the frame 4 except an area of the inner space defined by the frame 4. The sealant 5 may be, for example, a translucent insulating resin such as a silicone resin, an acrylic resin, or an epoxy resin, or translucent glass. The sealant 5 has a refractive index of, for example, 1.4 to 1.6 inclusive.

The wavelength conversion member 6 is placed on the upper surface of the sealant 5 in the upper area of the inner space defined by the substrate 2 and the frame 4. The wavelength conversion member 6 is sized to fit inside the frame 4. The wavelength conversion member 6 converts the wavelength of light emitted from the light emitters 3. More specifically, the wavelength conversion member 6 receives light emitted from the light emitters 3 through the sealant 5. The light emitted from the light emitters 3 and incident on the wavelength conversion member 6 excites phosphors in the wavelength conversion member 6, which then emit fluorescence. The wavelength conversion member 6 emits light by transmitting part of the light emitted from the light emitters 3. The wavelength conversion member 6 is formed from, for example, a translucent insulating resin such as a fluororesin, a silicone resin, an acrylic resin, or an epoxy resin, or translucent glass. The insulating resin or the glass contains phosphors. The phosphors are uniformly dispersed in the wavelength conversion member 6. The light emitters 3 and the phosphors contained in the wavelength conversion member 6 are selected to obtain the light-emitting device 1 that emits light with an emission spectrum shown in FIG. 4.

The light-emitting device 1 according to the embodiment of the present invention includes the light emitters 3 (or a first light emitter 31 for multiple light emitters) having a third peak wavelength λ3 in the region of 280 to 315 nm, and the phosphors including, for example, a first phosphor 61 that emits blue fluorescence having the first peak wavelength λ1 (described later) and a second phosphor 62 that emits blue-green fluorescence having a second peak wavelength λ2. Additionally, the light-emitting device 1 may contain a phosphor that emits green fluorescence, a phosphor that emits red fluorescence, and a phosphor that emits fluorescence in the near-infrared region.

For example, the first phosphor 61 showing blue is $BaMgAl_{10}O_{17}:Eu$, $(Sr, Ca, Ba)_{10}(PO_4)_6Cl_2:Eu$, or $(Sr, Ba)_{10}(PO_4)_6Cl_2:Eu$, and the second phosphor 62 showing blue-green is $(Sr, Ba, Ca)_5(PO_4)_3Cl:Eu$ or $Sr_4Al_{14}O_{25}:Eu$. The phosphor showing green is $SrSi_2(O, Cl)_2N_2:Eu$, $(Sr, Ba, Mg)_2SiO_4:Eu^{2+}$, $ZnS:Cu, Al$, or $Zn_2SiO_4:Mn$. The phosphor showing red is $Y_2O_2S:Eu$, $Y_2O_3:Eu$, $SrCaClAlSiN_3:Eu^{2+}$, $CaAlSiN_3:Eu$, or $CaAlSi(ON)_3:Eu$. The phosphor showing fluorescence in the near-infrared region is $3Ga_5O_{12}:Cr$.

The light-emitting device 1 according to the embodiment of the present invention mixes, in its emission spectrum in a wavelength region of 280 to 950 nm, fluorescence emitted from phosphors such as the first phosphor 61 and the second phosphor 62, and light emitted from the light emitter 3. This excites emission of light having a first peak wavelength in a wavelength region of 400 to 480 nm and light having a second peak wavelength in a wavelength region of 480 to 600 nm for the light emitted from the light emitters 3.

The light-emitting device 1 according to the embodiment of the present invention can thus reduce color variations in emitted light that may result from variations at peak wavelengths of fluorescence output from the first phosphor 61 and the second phosphor 62, which may result from variations in the temperature of each phosphor. More specifically, when, for example, the first phosphor 61 or the second phosphor 62 outputs fluorescence that varies at the peak wavelength, the variation may be corrected using fluorescence from other phosphors. The light-emitting device 1 is thus more likely to retain a predetermined color of emitted light. The light-emitting device 1 according to the embodiment of the present invention can thus reduce color variations in emitted light resulting from variations in the intensities of fluorescence emitted from the phosphors at the peak wavelengths.

The light-emitting device 1 having the third peak wavelength $\lambda 3$ in the region of 280 to 315 nm (ultraviolet B or UVB region) emits light more similar to sunlight in the ultraviolet region. The light-emitting device 1 can thus serve as a light source suitable for growing plants or for use in weather-resistant tests. For raising living things indoors, light in the region of 280 to 315 nm (UVB region) illuminating terrestrial animals such as reptiles and amphibians allows these animals to generate nutrients such as vitamin D in their body and effectively maintains their health conditions. For growing plants, light containing near-ultraviolet rays provides proper stress to plants. Such light allows, for example, brightly colored vegetables to increase the vitamin C content. Such light can improve the features of plants as food.

The light-emitting device 1 according to the embodiment of the present invention emits light with higher color rendering having a spectrum more similar to the solar spectrum. In other words, the light-emitting device 1 according to the embodiment of the present invention has the relative intensities in the emission spectrum with a smaller difference from the relative intensities in the solar spectrum. The light-emitting device 1 with this structure emits light similar to sunlight.

In the light-emitting device 1 according to another embodiment of the present invention, the light intensity of the emission spectrum at the third peak wavelength $\lambda 3$ in the wavelength region of 280 to 315 nm (UVB region) is 3 to 30% inclusive of the light intensity at the maximum peak wavelength (maximum peak light intensity) in the entire wavelength region of 280 to 950 nm. The maximum peak light intensity refers to the maximum light intensity in the spectrum in the region of 280 to 950 nm. The maximum peak wavelength refers to a wavelength with the maximum relative light intensity in the spectrum in the region of 280 to 950 nm. The light-emitting device 1 thus emits light with a spectrum similar to the solar spectrum in the ultraviolet and violet regions and having less color variations. More specifically, the light-emitting device 1 emits light with an emission spectrum in the near-ultraviolet and visible light wavelength regions and having less color variations in the ultraviolet region resulting from variations in the intensity of light from any of the light emitters 3 or the phosphors, or in other words, variations in the relative light intensities plotted on the vertical axis in FIG. 4.

The light-emitting device 1 according to the embodiment of the present invention may have, in its emission spectrum, a difference between the highest light intensity and the lowest light intensity of 20% or less in a wavelength region of 430 to 700 nm. The light-emitting device 1 can thus reduce the likelihood of emitted light having greatly varying colors in the blue to yellow regions.

The light-emitting device 1 has the maximum peak wavelength in the visible light region of 400 to 600 nm. The wavelength having the maximum peak wavelength is the first peak wavelength $\lambda 1$ or the second peak wavelength $\lambda 2$. The light-emitting device 1 having the maximum peak wavelength in the region of 400 to 600 nm can emit light with a spectrum similar to the solar spectrum, and can thus serve as a light source suitable for raising living things or growing plants.

The light-emitting device 1 may further include a second light emitter 32 in addition to the first light emitter 31. The second light emitter 32 emits light having a fourth peak wavelength $\lambda 4$ in a wavelength region of 315 to 400 nm. The light-emitting device 1 having the fourth peak wavelength $\lambda 4$ in the region of 315 to 400 nm emits light more similar to sunlight in the ultraviolet region. The light-emitting device 1 can thus serve as a light source suitable for growing plants or for use in weather-resistant tests. For raising living things indoors, light in the region of 315 to 400 nm (ultraviolet A or UVA region) illuminating terrestrial animals such as reptiles and amphibians can improve their life support functions such as thermoregulation and growth promotion. For growing plants, light containing near-ultraviolet rays provides proper stress to plants. Such light allows, for example, brightly colored vegetables to increase the vitamin C content. Such light can improve the features of plants as food.

FIGS. 4 and 5 are graphs showing example fluorescence spectra of the first phosphor 61 and the second phosphor 62 included in the phosphors used in the light-emitting device 1 according to the present embodiment. The spectra shown in the graphs are relative light intensities defined when the maximum light intensity of each spectrum is 1. The emission spectrum and the fluorescence spectra shown in FIGS. 4 and 5 indicate relative light intensities based on actual measured values.

The light intensity in the UVB region or less, or in other words, 315 nm or less, may be 50% or less of the light intensity at the peak wavelength $\lambda 4$ in the UVA region (315 to 400 nm). The light-emitting device 1 can thus reduce excessive light in the ultraviolet region.

The light intensity at the fourth peak wavelength $\lambda 4$ may be 20 to 60% inclusive of the maximum peak light intensity in the entire wavelength region of 280 to 950 nm. This structure can reduce excessive light in the ultraviolet region, and reduce, for example, damage on the skin resulting from excessive exposure to ultraviolet rays (in other words, sunburn). The light intensity at the fourth peak wavelength $\lambda 4$ is 20% or more of the maximum peak light intensity, allowing emission of light with a spectrum similar to sunlight.

The light-emitting device 1 according to the embodiment of the present invention is used in an illumination apparatus for indoor use, such as in a building or in a house. In one example, multiple light-emitting devices 1 are arranged. In one example, an illumination apparatus for a living space including the light-emitting devices 1 placed indoors can create a lighting environment that simulates an environment illuminated with sunlight. In another example, an illumination apparatus for visual inspection of painted products, such as automobiles, including the light-emitting devices 1 placed indoors can create an inspection environment that simulates an environment illuminated with sunlight. In color inspection, an inspection target illuminated indoors with light similar to sunlight can appear in colors similar to the colors under sunlight (with improved color rendering). The color inspection can be more accurate. For raising living things indoors, light in the region of 280 to 315 nm (UVB region) illuminating terrestrial animals such as reptiles and amphibians allows these animals to generate nutrients such as vitamin D in their body and effectively maintain their health conditions.

The light-emitting device 1 according to the embodiments has been described. An illumination apparatus 10 according to an embodiment may include multiple light-emitting devices and have an emission spectrum similar to the light-emitting device 1. More specifically, similarly to the light-emitting device 1 described above, the illumination apparatus 10 incorporating multiple light-emitting devices including the light emitters 3 has a first peak wavelength in the wavelength region of 400 to 480 nm and a second peak wavelength in the wavelength region of 480 to 600 nm.

The illumination apparatus 10 including a third peak wavelength $\lambda3$ in the region of 280 to 315 nm emits light more similar to sunlight in the ultraviolet region. The illumination apparatus 10 can thus serve as a light source suitable for growing plants or for use in weather-resistant tests. For raising living things indoors, light in the region of 280 to 315 nm (UVB region) illuminating terrestrial animals such as reptiles and amphibians allows these animals to generate nutrients such as vitamin D in their body and effectively maintain their health conditions. For growing plants, light containing near-ultraviolet rays provides proper stress to plants. Such light allows, for example, brightly colored vegetables to increase the vitamin C content. Such light can improve the features of plants as food.

In the illumination apparatus 10 according to another embodiment of the present invention, the light intensity of the emission spectrum at the third peak wavelength $\lambda3$ in the wavelength region of 280 to 315 nm (UVB region) is 3 to 30% inclusive of the light intensity at the maximum peak wavelength (maximum peak light intensity) in the entire wavelength region of 280 to 950 nm. The illumination apparatus 10 thus emits light with a spectrum similar to the solar spectrum in the ultraviolet region and having less color variations.

The illumination apparatus 10 has the maximum peak wavelength in the visible light region of 400 to 600 nm. The wavelength having the maximum peak wavelength is the first peak wavelength $\lambda1$ or the second peak wavelength $\lambda2$. The illumination apparatus 10 having the maximum peak wavelength in the region of 400 to 600 nm can emit light with a spectrum similar to the solar spectrum, and can thus serve as a light source suitable for raising living things or growing plants. The illumination apparatus 10 may have, in its emission spectrum, a difference between the maximum light intensity and the minimum light intensity of 20% or less in the wavelength region of 430 to 700 nm. The illumination apparatus 10 can thus reduce the likelihood of emitted light having greatly varying colors in the blue to yellow regions.

The light intensity in the UVB region or less, or in other words, 315 nm or less, may be 50% or less of the light intensity at the peak wavelength $\lambda4$ in the UVA region (315 to 400 nm). The illumination apparatus 10 can thus reduce excessive light in the ultraviolet region.

The light intensity at the fourth peak wavelength $\lambda4$ may be 20 to 60% inclusive of the maximum peak light intensity in the entire wavelength region of 280 to 950 nm. This structure can reduce excessive light in the ultraviolet region, and reduce damage on the skin resulting from excessive exposure to ultraviolet rays (in other words, sunburn). The light intensity at the fourth peak wavelength $\lambda4$ is 20% or more of the maximum peak light intensity, allowing emission of light with a spectrum similar to sunlight.

An illumination apparatus including the light-emitting devices 1 according to the present embodiment will now be described with reference to the accompanying drawings.

Structure of Illumination Apparatus

Figure 6:
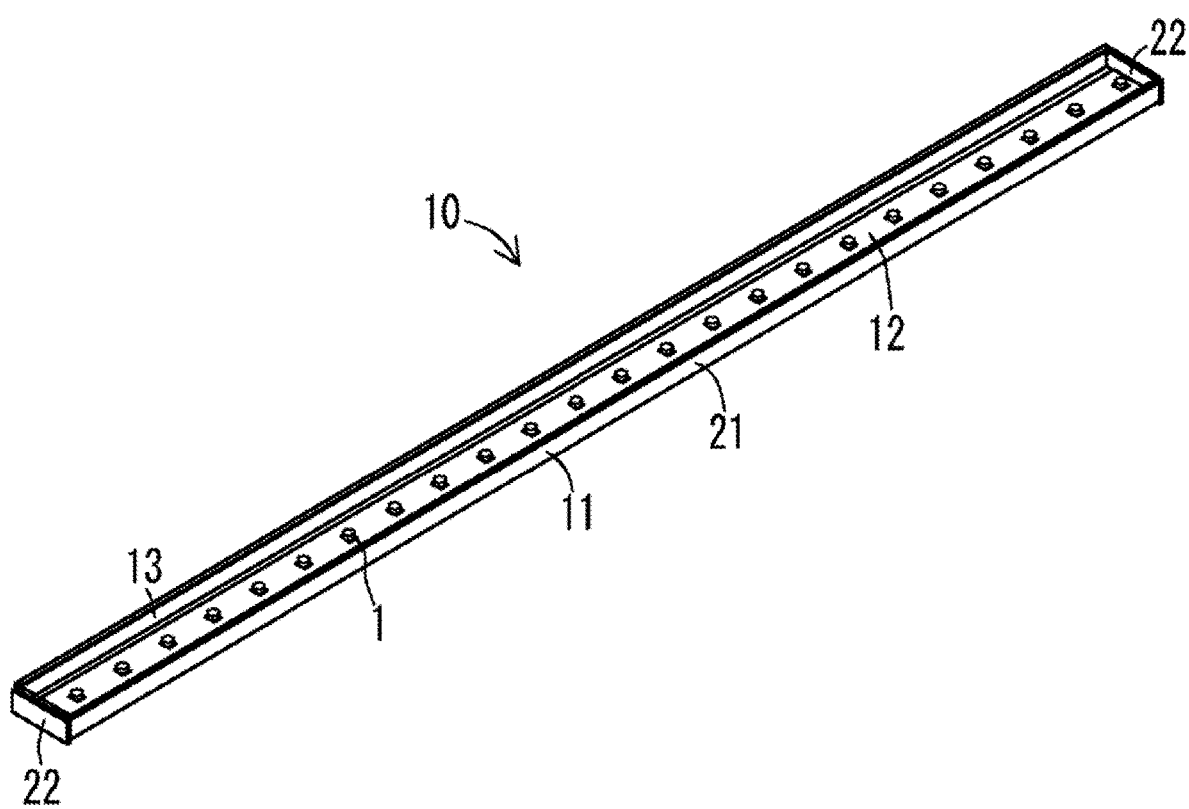
FIG. 6 is an external perspective view of an illumination apparatus including the light-emitting devices according to an embodiment of the present invention.
Figure 7:
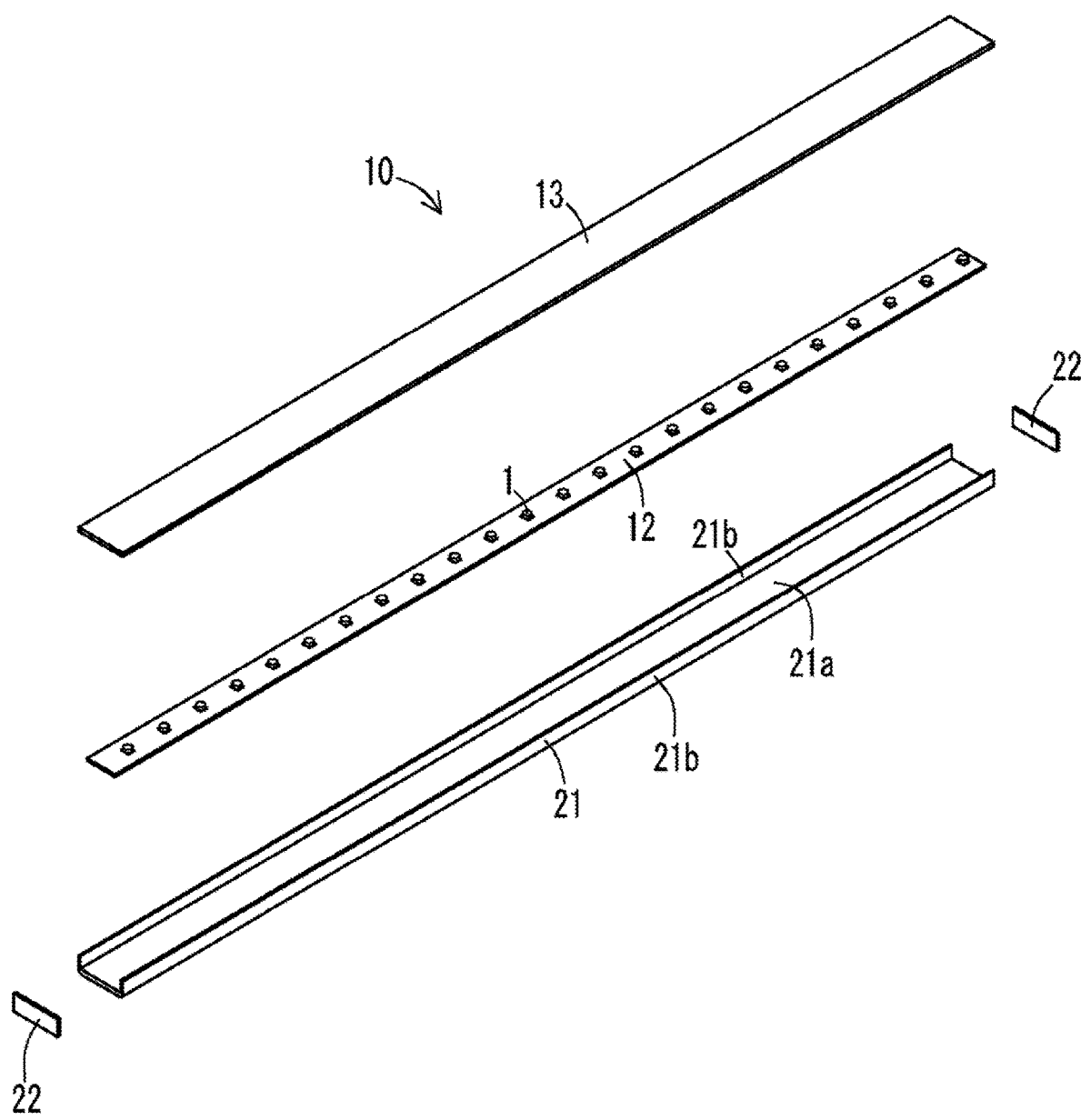
FIG. 7 is an exploded perspective view of the illumination apparatus according to the embodiment of the present invention.
Figure 8:
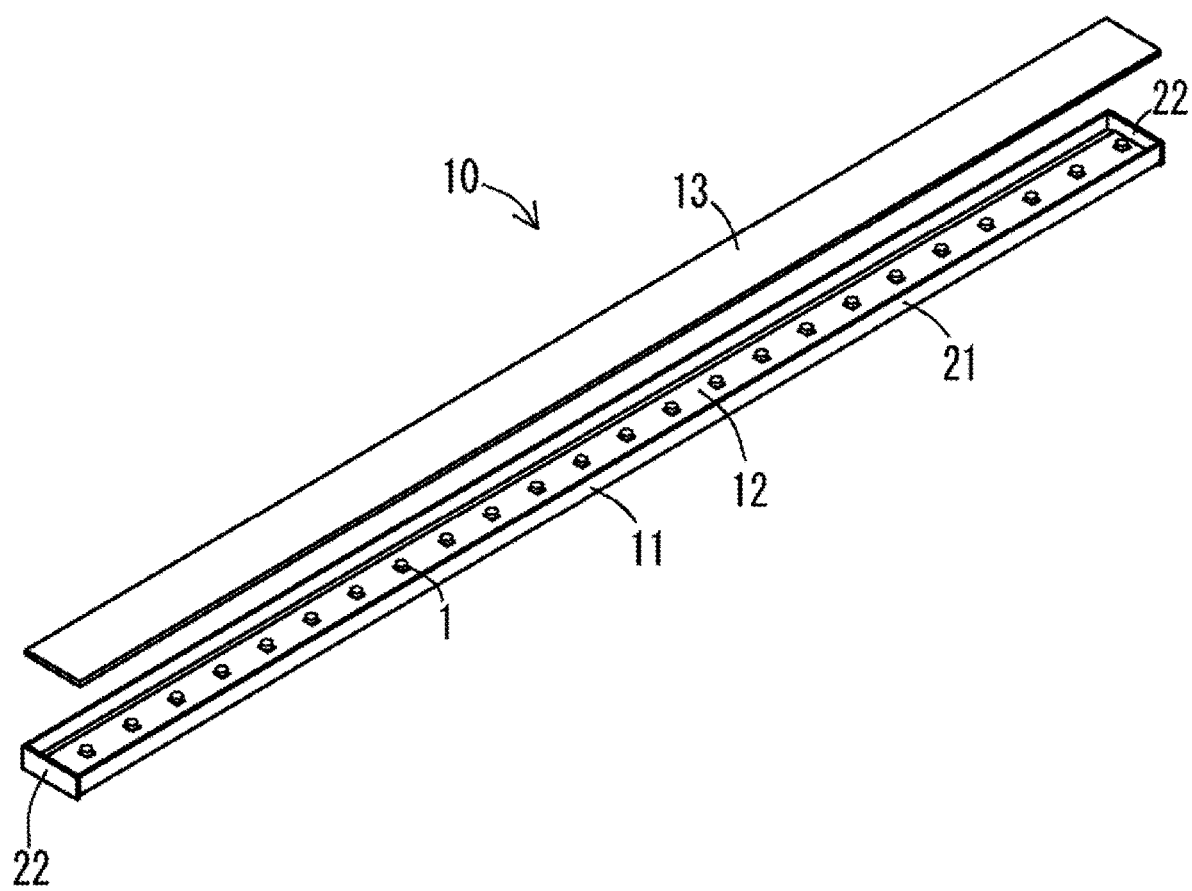
FIG. 8 is a perspective view of the illumination apparatus according to the embodiment of the present invention with a translucent substrate removed from a housing of the illumination apparatus.

FIG. 6 is an external perspective view of the illumination apparatus including the light-emitting devices according to the present embodiment. FIG. 7 is an exploded perspective view of the illumination apparatus shown in FIG. 6. FIG. 8 is a perspective view of the illumination apparatus shown in FIG. 6 with a translucent substrate removed from a housing of the illumination apparatus. The illumination apparatus 10 includes multiple light-emitting devices each including the light emitters. The mixture of light emitted from the multiple light-emitting devices has the first peak wavelength in the wavelength region of 400 to 480 nm, the second peak wavelength in the wavelength region of 480 to 600 nm, and the third peak wavelength in the wavelength region of 280 to 315 nm.

The illumination apparatus 10 includes an elongated housing 11 that is open upward, multiple light-emitting devices 1 that are arranged linearly in the longitudinal direction in the housing 11, an elongated wiring board 12 on which the light-emitting devices 1 are mounted, and an elongated translucent substrate 13 supported by the housing 11 and closing the opening of the housing 11.

The illumination apparatus 10 may have the above spectrum of the light-emitting devices 1. In this case, the light emitters 3 similarly have the third peak wavelength $\lambda3$ in the region of 280 to 315 nm, and the phosphors may be changed as appropriate to reproduce the light.

The housing 11 supports the translucent substrate 13 and dissipates heat generated by the light-emitting devices 1 outside. The housing 11 is formed from, for example, metal such as aluminum, copper, or stainless steel, plastics, or a resin. The housing 11 has a bottom 21a extending in the longitudinal direction, a pair of supports 21b extending upright from the two ends of the bottom 21a in the width direction and extending in the longitudinal direction, an elongated body 21 that is open upward and open at two ends in the longitudinal direction, and two lids 22 for closing the open ends in the longitudinal direction of the body 21. The supports 21b each have, on the upper inner surface of the housing 11, holders including recesses facing each other to support the translucent substrate 13 in the longitudinal direction. The housing 11 has a length of, for example, 100 to 2000 mm inclusive, in the longitudinal direction.

The wiring board 12 is fixed on the bottom inside the housing 11. The wiring board 12 may be, for example, a printed board such as a rigid printed board, a flexible printed board, or a rigid flexible printed board. The wiring pattern on the wiring board 12 and the wiring pattern on the substrate 2 included in each light-emitting device 1 are electrically connected to each other with solder or conductive adhesive. A signal from the wiring board 12 is transmitted to the light emitters 3 through the substrate 2. The light emitters 3 then emit light. The wiring board 12 is powered by an external power source through wiring.

The translucent substrate 13 is formed from a material that transmits light emitted from each light-emitting device 1. The translucent substrate 13 is formed from, for example, a translucent material such as an acrylic resin or glass. The translucent substrate 13 is a rectangular plate, and has a length of, for example, 98 to 1998 mm inclusive in the longitudinal direction. The translucent substrate 13 is inserted through either of the two open ends of the main body 21 in the longitudinal direction along the above recesses on the supports 21b, is then slid in the longitudinal direction, and is thus supported by the pair of supports 21b at positions spaced from the multiple light-emitting devices 1. The open ends of the main body 21 in the longitudinal direction are then closed with the lids 22. This completes the illumination apparatus 10.

The illumination apparatus 10 described above is a line emission apparatus including the multiple light-emitting devices 1 arranged linearly. In some embodiments, the illumination apparatus 10 may be a plane emission apparatus including multiple light-emitting devices 1 arranged in a matrix or in a staggered pattern.

Although each light-emitting device 1 according to the embodiment of the present invention includes the five different phosphors in the single wavelength conversion member 6 as described above, or specifically the first phosphor 61 for emitting blue fluorescence, the second phosphor 62 for emitting blue-green fluorescence, the phosphor for emitting green fluorescence, the phosphor for emitting red fluorescence, and the phosphor for emitting fluorescence in the near-infrared region, the light-emitting device 1 may include two different wavelength conversion members. When the light-emitting device 1 includes two different wavelength conversion members, a first wavelength conversion member and a second wavelength conversion member may include different phosphors in a dispersed manner, or may include different combinations of phosphors in a dispersed manner. Light emitted through one wavelength conversion member may then be mixed with light emitted through the other wavelength conversion member. This facilitates the control of color rendering of the emitted light.

The light-emitting device 1 shown in FIGS. 1 and 2 was fabricated and evaluated for its color rendering. The multiple light emitters 3, which emit excitation light, are gallium nitride light emitters that emit light with peak wavelengths in the region of 280 to 315 nm.

The first phosphor 61 is $(Sr, Ca, Ba)_{10}(PO_4)_6Cl_2$:Eu, and the second phosphor 62 showing blue-green is $Sr_4Al_{14}O_{25}$:Eu. The phosphor showing green is $SrSi_2(O, Cl)_2N_2$:Eu. The phosphor showing red is $CaAlSi(ON)_3$:Eu. The phosphor showing fluorescence in the near-infrared region is $3Ga_5O_{12}$:Cr.

The resultant light-emitting device 1 has the emission spectrum shown in FIG. 4.

The present invention is not limited to the examples described in the above embodiments, and may be modified in various aspects including numerical values. Various combinations of the features are not limited to the examples described in the above embodiments.

REFERENCE SIGNS LIST 1 light-emitting device
10 illumination apparatus
11 housing
12 wiring board
13 translucent substrate
2 substrate
21 body
21a bottom
21b support
22 lid
3 light emitter
31 first light emitter
32 second light emitter
4 frame
5 sealant
6 wavelength conversion member
61 first phosphor
62 second phosphor
λ1 first peak wavelength
λ2 second peak wavelength
λ3 third peak wavelength
λ4 fourth peak wavelength

The invention claimed is:

1. A light-emitting device, comprising:
   at least one light emitter;
   a first phosphor to emit, in response to light emitted from the at least one light emitter, light having a first peak wavelength in a wavelength region of 400 to 480 nm; and
   a second phosphor to emit, in response to light emitted from the at least one light emitter, light having a second peak wavelength in a wavelength region of 480 to 600 nm,
   wherein the at least one light emitter has a third peak wavelength in a wavelength region of 280 to 315 nm and emits light in the wavelength region of 280 to 315 nm, and an emission spectrum of the light emitting device has the third peak wavelength in a 'wavelength region of 280 to 315 nm, and wherein a ratio of a light intensity at the third peak wavelength to a light intensity at a maximum peak wavelength with a maximum light intensity in an entire wavelength region of the emitted light is 3 to 30%.

2. The light-emitting device according to claim 1, wherein the first peak wavelength or the second peak wavelength is the maximum peak wavelength with the maximum light intensity in the entire wavelength region of the emitted light.

3. The light-emitting device according to claim 1, further comprising:
   a second light emitter having a fourth peak wavelength in a wavelength region of 315 to 400 nm.

4. The light-emitting device according to claim 1, wherein the at least one light emitter comprises a plurality of light emitters.

5. An illumination apparatus, comprising:
   one or more of the light-emitting devices according to claim 1; and
   a housing including the one or more of the light-emitting devices.

6. The light-emitting device according to claim 1, wherein the emission spectrum has a difference between the highest light intensity and the lowest intensity of 20% or less in a wavelength region of 430 to 700 nm.

7. The light-emitting device according to claim 1, wherein the emission spectrum of the light emitting device has the third peak wavelength in a wavelength region of 280 to 300 nm.

8. The light-emitting device according to claim 1, further comprising:
   a third phosphor to emit, in response to light emitted from the at least one light emitter, light having a fifth peak wavelength in a wavelength region of 580 to 680 nm.

9. The light-emitting device according to claim 3, wherein a light intensity in a wavelength region of 315 nm or less is 50% or less of a light intensity at the fourth peak wavelength.

10. The light-emitting device according to claim 3, wherein a light intensity at the fourth peak wavelength is 20 to 60% inclusive of a light intensity at the maximum peak wavelength with the maximum light intensity in the entire wavelength region of the emitted light.

11. An illumination apparatus, comprising:

a plurality of light-emitting devices each including a light emitter, wherein a mixture of light emitted from the plurality of light-emitting devices has a first peak wavelength in a wavelength region of 400 to 480 nm, a second peak wavelength in a wavelength region of 480 to 600 nm, and a third peak wavelength in a wavelength region of 280 to 315 nm, and an emission spectrum of the illumination apparatus has the third peak wavelength in a wavelength region of 280 to 315 nm, and wherein a light intensity at the third peak wavelength is 3 to 30% inclusive of a light intensity at a maximum peak wavelength with a maximum light intensity in an entire wavelength region of the mixture of light.

12. The illumination apparatus according to claim 11, wherein the first peak wavelength or the second peak wavelength is the maximum peak wavelength with the maximum light intensity in the entire wavelength region of the mixture of light.

13. The illumination apparatus according to claim 11, wherein the mixture of light has a fourth peak wavelength in a wavelength region of 315 to 400 nm, and a light intensity in a wavelength region of 315 nm or less is 50% or less of a light intensity at the fourth peak wavelength.

14. The illumination apparatus according to claim 13, wherein the light intensity at the fourth peak wavelength is 20 to 60% inclusive of the light intensity at the maximum peak in the entire wavelength region of the mixture of light.

15. The illumination apparatus according to claim 13, wherein the emission spectrum has a difference between the highest light intensity and the lowest intensity of 20% or less in a wavelength region of 430 to 700 nm.

16. The illumination apparatus according to claim 13, wherein the emission spectrum of the light emitting device has the third peak wavelength in a wavelength region of 280 to 300 nm.

17. The illumination apparatus according to claim 13, further comprising:

a third phosphor to emit, in response to light emitted from the at least one light emitter, light having a fifth peak wavelength in a wavelength region of 580 to 680 nm.

* * * * *